United States Patent
Huang et al.

(10) Patent No.: US 6,943,439 B2
(45) Date of Patent: Sep. 13, 2005

(54) SUBSTRATE AND FABRICATION METHOD OF THE SAME

(75) Inventors: Chien-Ping Huang, Hsinchu (TW); Han-Ping Pu, Taipei (TW); Chih-Chin Liao, Changhua (TW)

(73) Assignee: Siliconware Precision Industries Co., Ltd. (TW)

(*) Notice: Subject to any disclaimer, the term of this patent is extended or adjusted under 35 U.S.C. 154(b) by 0 days.

(21) Appl. No.: 10/116,204

(22) Filed: Apr. 4, 2002

(65) Prior Publication Data

US 2003/0137035 A1 Jul. 24, 2003

(30) Foreign Application Priority Data

Jan. 24, 2002 (TW) ........................................ 91101125 A

(51) Int. Cl.$^7$ ........................ H01L 23/02; H01L 23/495; H01L 23/48; H01L 23/52; H01L 29/40
(52) U.S. Cl. ..................... 257/680; 257/688; 257/673; 257/676; 257/738
(58) Field of Search ................................ 257/797, 668, 257/673, 676, 680, 690, 737, 738, 774, 784, 691, 678; 174/250, 260; 361/748

(56) References Cited

U.S. PATENT DOCUMENTS

| | | | |
|---|---|---|---|
| 5,512,712 A | * | 4/1996 | Iwata et al. .................. 174/258 |
| 6,512,288 B1 | * | 1/2003 | Shin et al. .................. 257/678 |
| 2002/0028586 A1 | * | 3/2002 | Haley et al. ................. 438/784 |

* cited by examiner

Primary Examiner—Nathan J. Flynn
Assistant Examiner—Victor A. Mandala, Jr.
(74) Attorney, Agent, or Firm—Peter F. Corless; Steven M. Jensen; Edwards & Angell, LLP

(57) ABSTRACT

A substrate and a fabrication method thereof are proposed, with at least a check point being formed on the substrate. Prior to wire bonding and/or molding processes, cleanness of the substrate (cleaned by plasma) is determined according to color variation of the check point, so as to allow only cleaned and contamination-free substrates to be subsequently formed with bonding wires and encapsulants thereon. Thereby, qualities of wire-bonded electrical connection and encapsulant adhesion for the substrate can be assured, which helps prevent the occurrence of delamination between the encapsulant and the substrate. Moreover, the check point formed on the substrate is made during general substrate fabrication by using current equipment and technique, and in a manner as not to interfere with trace routability on the substrate; thereby, costs and complexity of substrate fabrication would not undesirably increased.

9 Claims, 7 Drawing Sheets

SUBSTRATE AND FABRICATION METHOD OF THE SAME

FIELD OF THE INVENTION

The present invention relates to substrates and fabrication methods of the same, and more particularly, to a substrate that can accommodate a chip thereon for use in a BGA (ball grid array) semiconductor package, and a method for fabricating the substrate.

BACKGROUND OF THE INVENTION

General processes for fabricating semiconductor packages e.g. BGA semiconductor packages, include substrate loading, baking (at 120° C. for 1 hour), die bonding, curing (at 175° C. for 2 hours) and plasma cleaning etc, whereby plasma-cleaned substrates free of contaminant can be readily subjected to subsequent wire bonding and molding processes. This allows bonding wires and encapsulants to be formed on contamination-free substrates, and quality of packaged products can be assured. However, in practice, usually due to artificial errors or other reasons, some substrates are accidentally not cleaned by plasma, but directly used in the wire bonding and molding processes. These substrates inherent with contaminant may suffer quality degradation of wire bonding or electrical connection, and delamination would easily occur at interfaces between encapsulants and the contaminated substrates, making production yield of fabricated packages hardly improved.

Referring to FIG. 4, U.S. Pat. No. 6,068,129 discloses the forming of an indicator for indicating adhesion between an encapsulant and a substrate of a packaged electronic device. This indicator 11 is formed on a mold gate or runner 10 of the substrate 1, and made of solder mask that is also applied over other area on the substrate 1. Adhesion between the indicator 11 and the encapsulant (not shown) formed on the substrate 1 is good; while area of the mold gate 10 other than the indicator 11 is electrically plated with gold or palladium, making adhesion between the mold gate 10 and the encapsulant relatively poor. After the encapsulant is formed on the substrate 1, resin residues are usually remained on the mold gate 10 and need to be stripped off (customarily referred to as a degating process). During the degating process, if solder mask of the indicator 11 is entirely removed together with the resin residues, it indicates good adhesion between the substrate 1 and the encapsulant; on the other hand, if the indicator 11 is partly left on the mold gate 10, the encapsulant is proved not to be strongly bonded to the substrate 1, and delamination between the encapsulant and the substrate 1 may easily occur. Therefore, the provision of the indicator 11 allows packaged substrates firmly bonded with encapsulants to be selected and subsequently used for completing the fabrication of semiconductor packages.

However, the foregoing method for indicating adhesion between an encapsulant and a substrate has significant drawbacks. For example, this adhesion indicating method is carried out after forming the encapsulant, but not able to timely determine if the substrate is cleaned or contaminated before wire bonding and molding processes. As a result, packaged substrates not in good adhesion with encapsulants can only be discarded, which leads to considerable increase in material waste and costs, and also deterioration of fabrication productivity.

Therefore, how to promptly determine the cleanness of substrates before wire bonding and/or molding processes, and to assure bonding quality of bonding wires and encapsulants formed on the substrates, is a critical problem to solve.

SUMMARY OF THE INVENTION

A primary objective of the present invention is to provide a substrate formed with at least a check point thereon and a fabrication method of the substrate. Prior to wire bonding and/or molding processes, cleanness of the substrate can be determined according to color variation of the check point. This allows only cleaned substrates to be subsequently formed with bonding wires and encapsulants thereon, so that qualities of wire-bonded electrical connection and encapsulant adhesion for the substrates can be well assured. Moreover, the check point is simultaneously formed during substrate fabrication by using current equipment and technique, and in a manner as not to interfere with trace routability on the substrate; thereby, costs and complexity of substrate fabrication would not undesirably increased.

In accordance with the foregoing and above objectives, the present invention proposes a substrate and a fabrication method of the substrate. The substrate of the invention comprises: a core layer, at least a surface of the core layer being defined with a trace forming area; a plurality of conductive traces formed on the trace forming area of the core layer, each of the conductive traces having a first end portion and a second end portion opposed to the first end portion, allowing the first end portion to be urged with externally electrical connection so as to plate a metal layer on the second end portion; at least a check point formed on the surface of the core layer outside the trace forming area, the check point being spaced apart from the conductive traces and free of externally electrical connection; and at least a solder mask layer applied over the surface of the core layer formed with the conductive traces and the check point, allowing the second end portions of the conductive traces and the check point to be exposed to outside of the solder mask layer.

The foregoing substrate is fabricated by the following steps of: preparing a core layer, at least a surface of the core layer being defined with a trace forming area; forming a plurality of conductive traces on the trace forming area of the core layer, and forming at least a check point on the surface of the core layer outside the trace forming area, wherein each of the conductive traces has a first end portion and a second end portion opposed to the first end portion, allowing the first end portions of the conductive traces to be urged with externally electrical connection, and the check point is spaced apart from the conductive traces and free of externally electrical connection; applying at least a solder mask layer over the surface of the core layer formed with the conductive traces and the check point; and exposing the second end portions of the conductive traces and the check point to outside of the solder mask layer.

The substrate fabricated by the foregoing method further comprises a plating bus formed on the surface of the core layer having the conductive traces and the check point, wherein the first end portions of the conductive traces are connected to the plating bus. Then, an electrically-plating process can be performed, in which the first end portions of the conductive traces are electrically connected to an external plating device by means of the plating bus, so as to plate gold or nickel/gold alloy on the second end portions of the conductive traces. As the check point is made to be free of externally electrical connection, no metal layer is plated or deposited on the check point. Moreover, the conductive traces and the check point are formed by etching a copper film applied over the core layer, or the check point can be printed on the core layer of the substrate.

The invention is characterized in the forming of at least a copper-made check point on the substrate. Prior to wire bonding and/or molding processes, cleanness of the substrate (cleaned by plasma) is determined according to color variation of the check point, so as to allow only cleaned and contamination-free substrates to be subsequently formed with bonding wires and encapsulants thereon. Thereby, qualities of wire-bonded electrical connection and encapsulant adhesion for the substrate can be assured, which helps prevent the occurrence of delamination between the encapsulant and the substrate. Moreover, since substrate cleanness check is timely carried out before forming bonding wires and encapsulants, it can eliminate the drawbacks, such as material waste, cost increase and yield reduction, described in the prior art of an after-molding method for determining adhesion between an encapsulant and a substrate. In addition, the check point formed on the substrate is made during general substrate fabrication by using current equipment and technique, and in a manner as not to interfere with trace routability on the substrate; thereby, costs and complexity of substrate fabrication would not undesirably increased.

BRIEF DESCRIPTION OF THE DRAWINGS

The present invention can be more fully understood by reading the following detailed description of the preferred embodiments, with reference made to the accompanying drawings wherein.

DETAILED DESCRIPTION OF THE PREFERRED EMBODIMENT

The following description is made with reference to FIGS. 1A–1B and FIGS. 2A–2D for depicting a substrate and a fabrication method thereof proposed in the present invention. These drawings only illustrate associated components relating to the invention; for the sake of simplicity, these components are not drawn according to practically-used sizes or numbers. It is understood that, in practice, the substrate of the invention should be much more complexly made with respect to trace routability and component arrangement. Moreover, a substrate for use in a BGA semiconductor package is here exemplified in the preferred embodiments; however, it does not limit the scope of the substrate proposed in the invention.

Figure 1A:
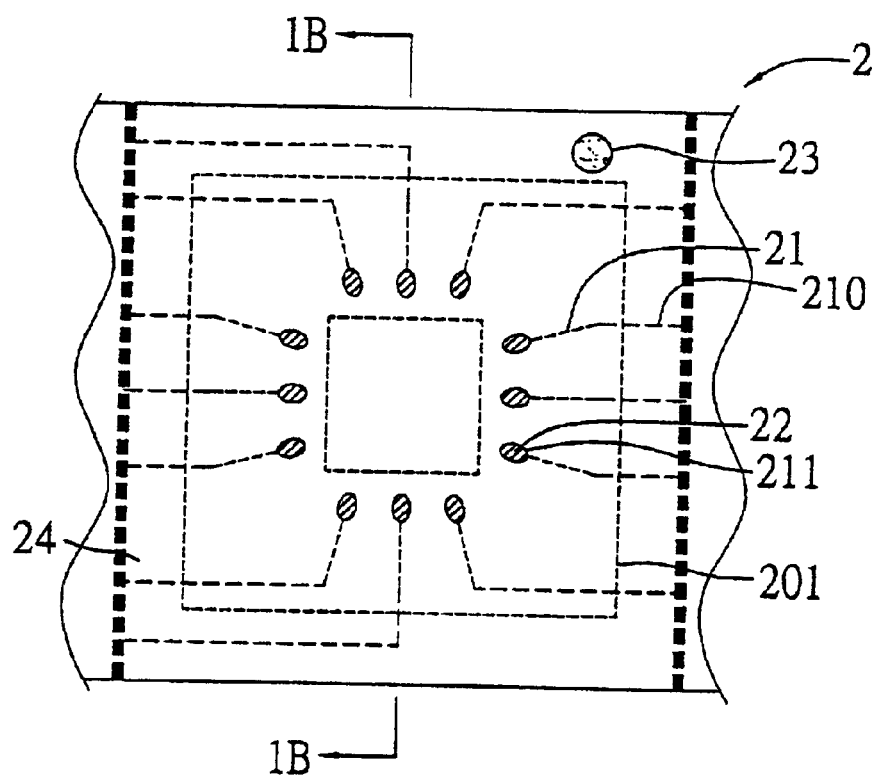
FIG. 1A is a top view of a substrate of the invention.
Figure 1B:
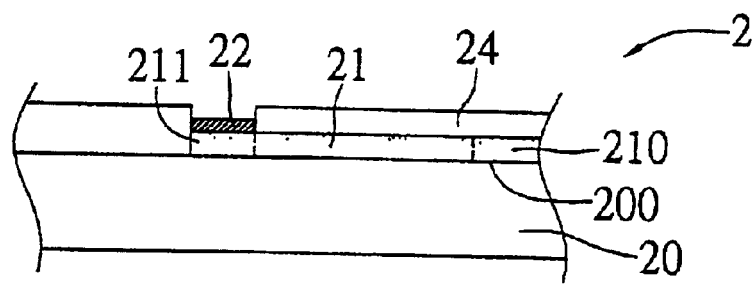
FIG. 1B is a partial cross-sectional view of a substrate of FIG. 1A cutting along a line 1B—1B.

Illustrated in FIGS. 1A and 1B is a substrate proposed in the present invention. As shown in the drawings, the substrate 2 comprises: a core layer 20, at least a surface 200 of the core layer 20 being defined with a trace forming area 201; a plurality of conductive traces 21 formed on the trace forming area 201 of the core layer 20, each of the conductive traces 21 having a first end portion 210 and a second end portion 211 opposed to the first end portion 210, allowing the first end portion 210 to be urged with externally electrical connection so as to plate a metal layer 22 on the second end portion 211; at least a check point 23 formed on the surface 200 of the core layer 20 outside the trace forming area 201, the check point 23 being spaced apart from the conductive traces 21 and free of externally electrical connection; and at least a solder mask layer 24 applied over the surface 200 of the core layer 20 formed with the conductive traces 21 and the check point 23, allowing the second end portions 211 of the conductive traces 21 and the check point 23 to be exposed to outside of the solder mask layer 24.

Figure 2A:
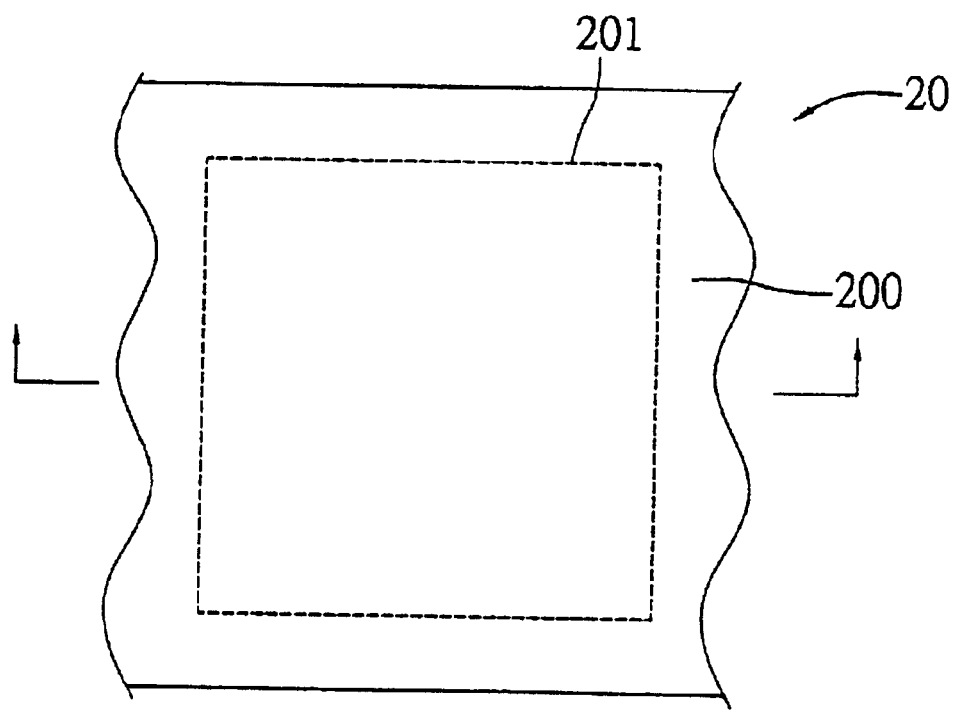
FIGS. 2A–2D are top and cross-sectional views showing the steps involved in a fabrication method of a substrate of the invention.
Figure 2A:
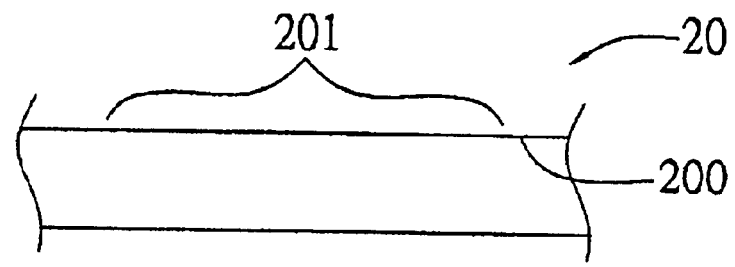

The foregoing substrate 2 is fabricated by the steps as follows. Referring to FIG. 2A, the first step is to prepare a core layer 20, wherein a trace forming area 201 is defined on at least a surface 200 of the core layer 20. The core layer 20 is made of a material selected from a group consisting of fiber glass, epoxy resin, polyimide, FR4 resin and BT (bismaleimide triazine) resin, etc.

Figure 2B:
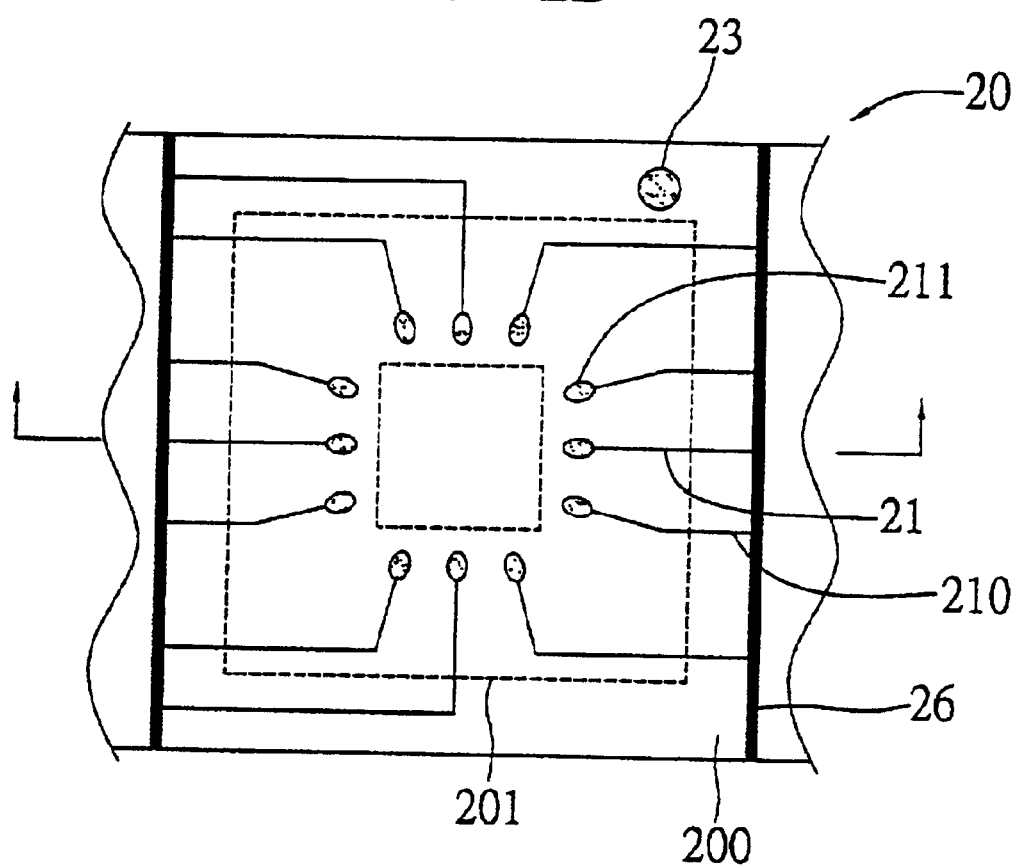
Figure 2B:
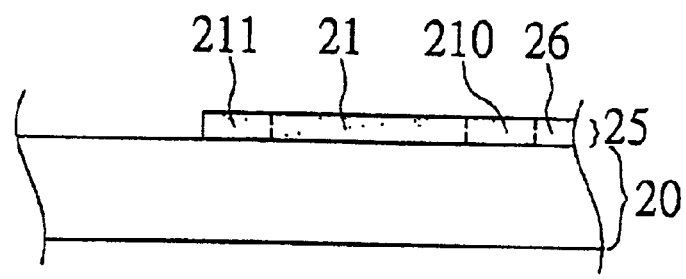

Referring to FIG. 2B, the next step is to apply a copper film 25 over the surface 200 of the core layer 20, which copper film 25 is patterned by using a conventional etching technique to form a plurality of conductive traces 21, at least a check point 23 and a plating bus 26 on the core layer 20. Alternatively, conventional printing means can be adopted to desirably form the check point 23 on the surface 200 of the core layer 20. Since etching or printing technology is well known in the art, no further description thereof is to be detailed herein.

In more detail, the conductive traces 21 are formed on the trace forming area 201 of the core layer 20. Each of the conductive traces 21 has a first end portion 210 and a second end portion 211 opposed to the first end portion 210, wherein the first end portion 210 is electrically connected to the plating bus 26, allowing the conductive trace 21 to be urged with externally electrical connection by means of the plating bus 26 in subsequent fabrication processes. The check point 23 is positioned outside the trace forming area 201 of the core layer 20, and spaced apart from the conductive traces 21 to be free of externally electrical connection. It should be noted that, shape and size of the check point 23 are not particularly limited; in other words, any suitable shape or size of the check point 23 can be applied in this invention.

Figure 2C:
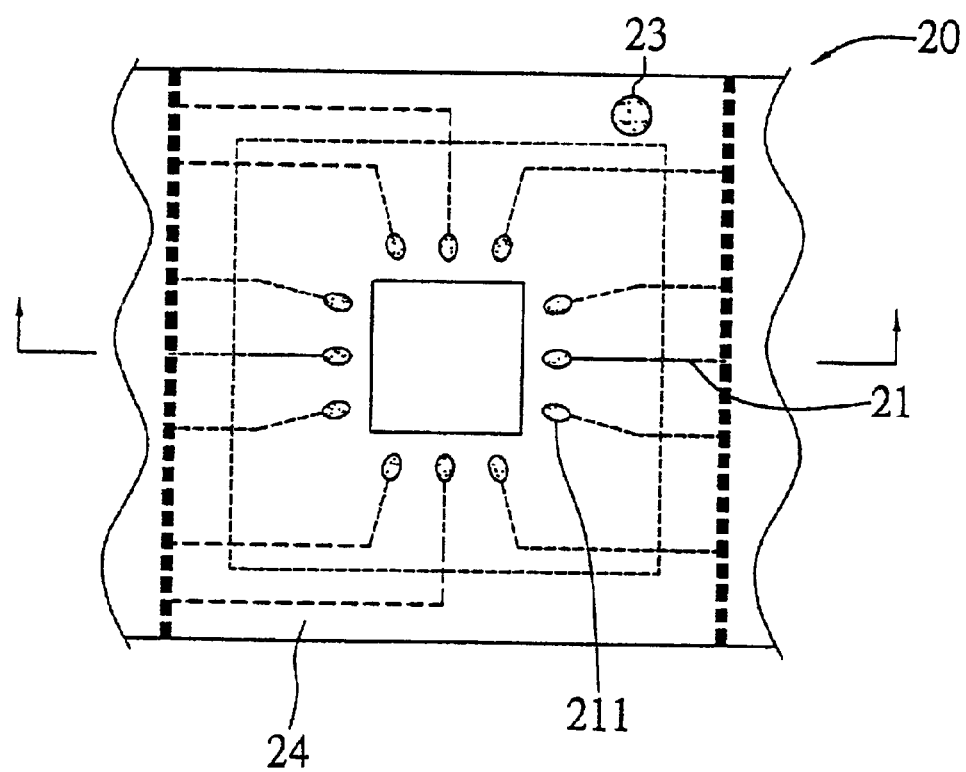
Figure 2C:
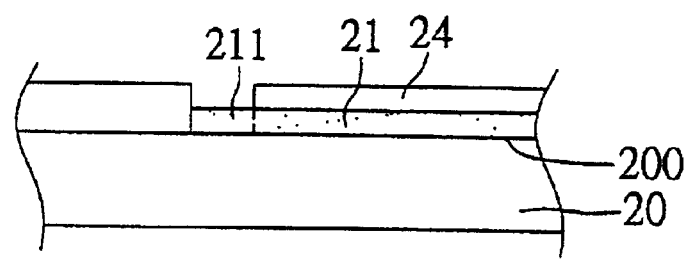

Referring further to FIG. 2C, a solder mask layer 24 is applied over the surface 200 of the core layer 20. The solder mask layer 24 is etched to expose the second end portions 211 of the conductive traces 21 and the check point 23 to outside of the solder mask layer 24.

Figure 2D:
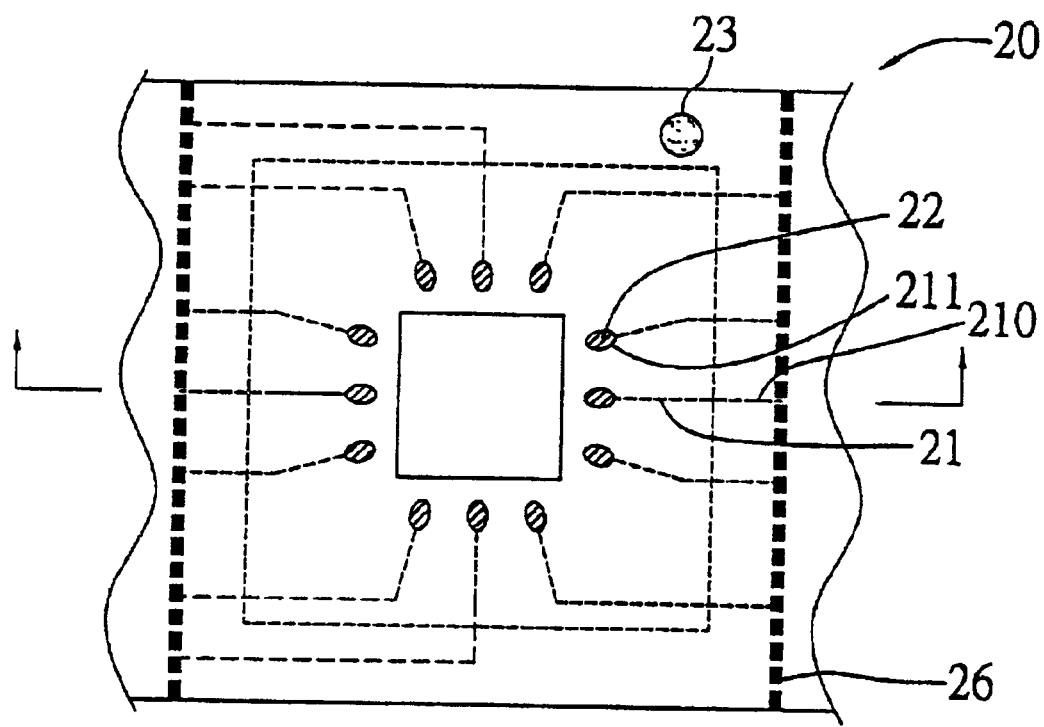
Figure 2D:
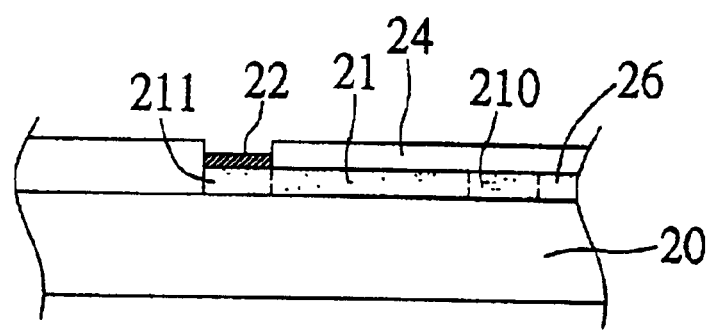

Referring to FIG. 2D, an electrically-plating process is performed for depositing a metal layer 22 on the exposed second end portion 211 of each of the conductive traces 21. The second end portion 211 is subsequently used as a bond finger for attaching a bonding wire thereto, or a ball pad for implanting a solder ball thereon. By virtue thereof, in order to enhance bonding strength between the bond finger and bonding wire or between the ball pad and solder ball, the second end portion 211 is normally plated with gold or nickel/gold alloy that forms the metal layer 20. The electrically-plating process is implemented by establishing electrical connection between the conductive traces 21 and an external plating device (not shown) in a manner that, the plating bus 26 associated with the first end portions 210 of the conductive traces 21, is adapted to be electrically coupled to the external plating device. Since this plating process is conventional, it is not to be further detailed herein. In another aspect, as the check point 23 is spaced apart from the conductive traces 21 and free of externally electrical connection, no metal layer 22 can be plated or deposited on the check point 23; thereby, the check point 23 maintains an original copper-gold color. Other subsequent processes for substrate fabrication are conventional and not to be further described herein.

In conclusion, the check point 23 formed on the substrate 2 is made during normal substrate fabrication by using current equipment and technique, and in a manner as not to interfere with trace routability on the substrate 2; therefore, costs and complexity of substrate fabrication would not be increased by the forming of the check point 23.

Figure 3:
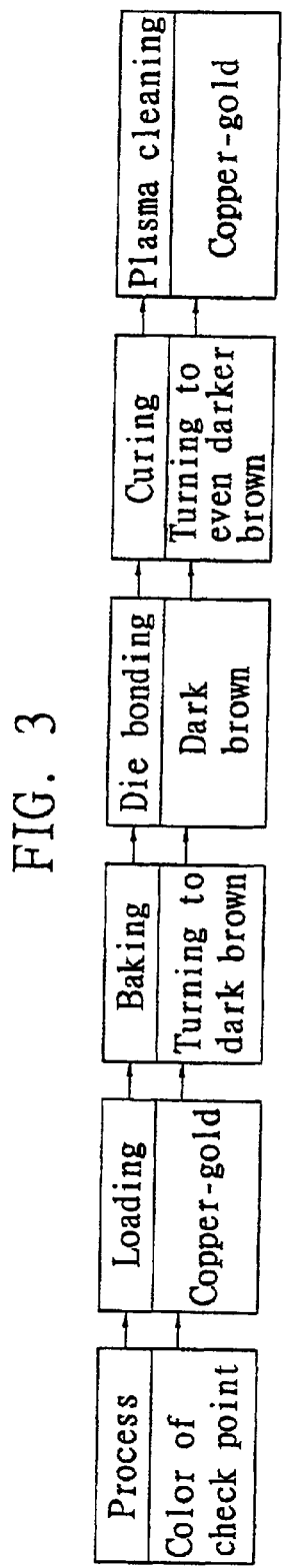
FIG. 3 is a flowchart showing color variation of a check point formed on a substrate prior to wire bonding and molding processes.
Figure 4:
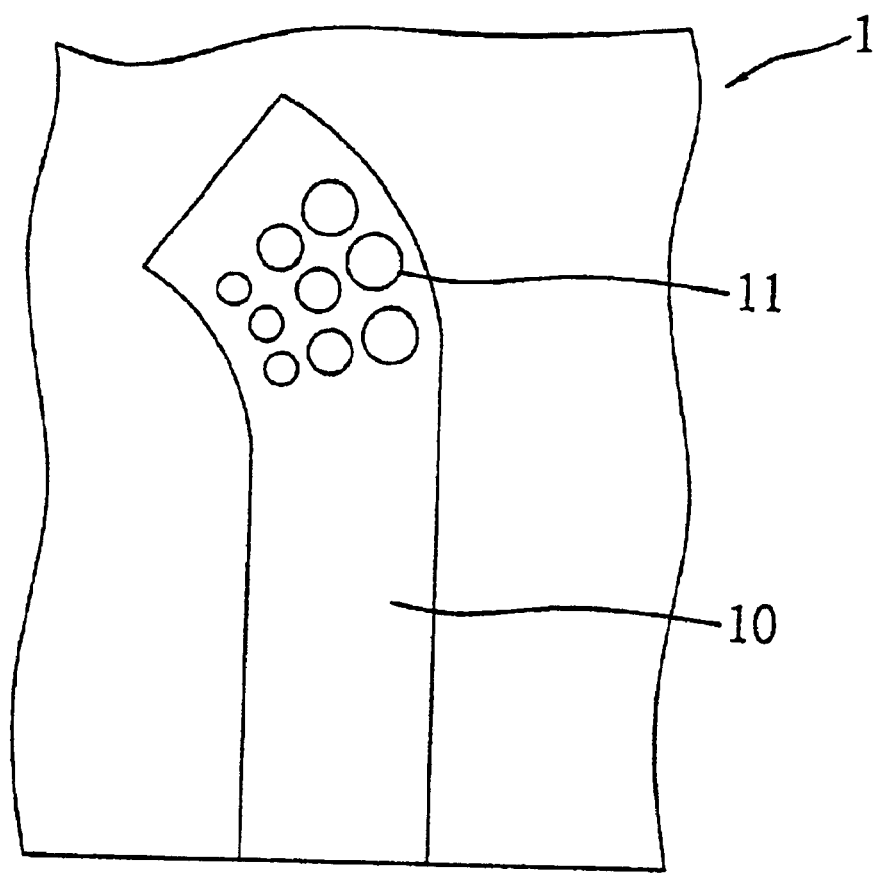
FIG. 4 (PRIOR ART) is a top view showing a conventional indicator used for indicating adhesion between a substrate and an encapsulant.

FIG. 3 illustrates a flowchart showing color variation of a check point formed on a substrate prior to wire bonding and molding processes. As shown in the drawing, the substrate 2 with the check point 23 as fabricated by the foregoing method, allows to utilize color variation of the check point 23 for checking if the substrate 2 is cleaned by plasma. In general, fabrication processes for semiconductor packages include substrate loading, baking (at 120° C. for 1 hour), die bonding, curing (at 175° C. for 2 hours) and plasma cleaning etc, whereby plasma-cleaned substrates free of contaminant can be readily used in subsequent wire bonding and molding processes. These fabrication processes are conventional, and not further to be detailed herein. During the processes from substrate loading to curing, the copper-made check point 23 would be oxidized under high temperature conditions, making color of the check point 23 change from copper-gold to dark brown. This dark brown color can be removed and recovered back to copper-gold after the substrate 2 is cleaned by plasma. Therefore, a substrate 2 with a check point 23 of a recovered copper-gold color is proved to be plasma-cleaned, and readily subjected to subsequent wire bonding and molding processes. On the other hand, if a check point 23 on a substrate 2 shows a color darker than copper-gold, this substrate 2 substantially needs to undergo the plasma-cleaning process before later usage. It is the characteristic feature of the invention that, prior to wire bonding and molding processes, cleanness of a substrate (cleaned by plasma) is determined according to color variation of a check point formed on the substrate, so as to allow only cleaned and contamination-free substrates to be subsequently formed with bonding wires and encapsulants thereon. Thereby, qualities of wire-bonded electrical connection and encapsulant adhesion for the substrate can be assured, which helps prevent the occurrence of delamination between the encapsulant and the substrate. Moreover, since substrate cleanness check is timely carried out before forming bonding wires and encapsulants, it can eliminate the drawbacks, such as material waste, cost increase and yield reduction, described in the prior art of an after-molding method for determining adhesion between an encapsulant and a substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A substrate, comprising:
   a core layer, at least a surface of the core layer being defined with a trace forming area;
   a plurality of conductive elements formed on the trace forming area of the core layer, each of the conductive elements having a first end portion and a second end portion opposed to the first end portion, allowing the first end portion to be urged with external electrical connection so as to plate a metal layer on the second end portion;
   at least a check point formed on the surface of the core layer outside the trace forming area, the check point being spaced apart from the conductive elements and free of external electrical connection, wherein the check point is adapted to change color for determining cleanness of the substrate after a plasma cleaning step is performed on the substrate, and the check point is located at a position between the trace forming area and an edge of the substrate; and
   at least a solder mask layer applied over the surface of the core layer formed with the conductive elements and the check point, allowing the second end portions of the conductive elements and the check point to be exposed to outside of the solder mask layer.

2. The substrate of claim 1, wherein the core layer is made of a material selected from a group consisting of fiber glass, epoxy resin, polyimide, FR4 resin and BT (bismaleimide triazine) resin.

3. The substrate of claim 1, wherein the conductive elements are conductive traces.

4. The substrate of claim 1, wherein the check point and the conductive elements are made of copper.

5. The substrate of claim 1, wherein the second end portion is a bond finger for attaching a bonding wire thereto.

6. The substrate of claim 1, wherein the second end portion is a ball pad for implanting a solder ball thereon.

7. The substrate of claim 1, wherein the metal layer is formed of a material selected from a group consisting of gold and nickel/gold alloy.

8. The substrate of claim 1, further comprising: a plating bus formed on the surface of the core layer having the conductive elements and the check point, allowing the first end portions of the conductive elements to be connected to the plating bus and urged with the externally electrical connection by means of the plating bus.

9. The substrate of claim 1, wherein the color of the check point changes from dark brown to copper-gold after the plasma cleaning step.

* * * * *